(12) United States Patent
Yamazawa (10) Patent No.: US 7,611,603 B2
(45) Date of Patent: Nov. 3, 2009

(54) PLASMA PROCESSING APPARATUS HAVING IMPEDANCE VARYING ELECTRODES

(75) Inventor: Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/691,706

(22) Filed: Mar. 27, 2007

(65) Prior Publication Data

US 2007/0227449 A1 Oct. 4, 2007

Related U.S. Application Data

(60) Provisional application No. 60/792,320, filed on Apr. 17, 2006.

(30) Foreign Application Priority Data

Mar. 31, 2006 (JP) ............... 2006-101051

(51) Int. Cl.
*C23F 1/02* (2006.01)
*C23C 16/00* (2006.01)
*H01J 7/24* (2006.01)

(52) U.S. Cl. ............... 156/345.44; 156/345.48; 156/345.47; 118/723 I; 118/723 E; 118/723 IR; 315/111.71; 315/111.41

(58) Field of Classification Search ............ 315/111.21, 315/111.71, 111.41, 111.11; 156/345.44, 156/345.48, 345.49, 345.29, 345.45, 345.47, 156/345.51, 345.28; 118/723 I, 723 IR, 723 R
See application file for complete search history.

(56) References Cited

U.S. PATENT DOCUMENTS

2002/0132380 A1* 9/2002 Nakano et al. ............... 438/14
2004/0035365 A1   2/2004 Yamazawa et al.
2006/0112878 A1* 6/2006 Ni et al. ................... 118/723 E

FOREIGN PATENT DOCUMENTS

JP         2004-96066          3/2004

* cited by examiner

*Primary Examiner*—Tuyet Vo
(74) *Attorney, Agent, or Firm*—Oblon, Spivak, McClelland, Maier & Neustadt, L.L.P.

(57) ABSTRACT

There is provided a plasma processing apparatus which processes a substrate by generating plasma in a process vessel by supply of radio frequency power from a radio frequency power source to at least one of a pair of vertically opposed electrodes disposed in the process vessel, the apparatus including an impedance varying circuit which is connected to at least one of the pair of electrodes and in which an impedance varying part varying impedance on the electrode side of the plasma generated in the process vessel and a resistor are connected in series.

10 Claims, 6 Drawing Sheets

PLASMA PROCESSING APPARATUS HAVING IMPEDANCE VARYING ELECTRODES

CROSS REFERENCE TO RELATED APPLICATIONS

The present invention contains subject matter related to Japanese Patent Application No. 2006-101051, filed on Mar. 31, 2006 and Provisional Application No. 60/792,320, filed on Apr. 17, 2006, the entire contents of which being incorporated herein by reference.

BACKGROUND OF THE INVENTION

1. Field of the Invention

The present invention relates to a plasma processing apparatus and a plasma processing method for processing a substrate by generating plasma in a process vessel.

2. Description of the Related Art

In manufacturing processes of, for example, a semiconductor device, a liquid crystal display device, and the like, plasma processing by a plasma processing apparatus is widely used as processing such as etching and film deposition to a semiconductor wafer. Such a plasma processing apparatus includes, in a process vessel, upper and lower electrodes facing each other, and radio frequency power is supplied to the lower electrode on which, for example, a substrate is placed to generate plasma between the lower electrode and the upper electrode, thereby processing the substrate.

In this plasma processing apparatus, to increase product yields, it is necessary to enhance wafer in-plane uniformity of the processing by controlling density distribution of the plasma generated in the process vessel. As one measure for this, the present applicant has disclosed a method to change impedance to a fundamental wave supplied from a radio frequency power source and its harmonics, on the electrode side of the plasma generated in the process vessel (see, Japanese Patent Application Laid-open No. 2004-96066).

In the process vessel of the plasma processing apparatus, the fundamental wave of the radio frequency power supplied to the electrode and various high-order harmonics of the fundamental wave are generated during the plasma processing. According to the method disclosed in the above Japanese Patent Application Laid-open No. 2004-96066, the impedance to the fundamental wave from the radio frequency power source and its harmonics, on the electrode side of the plasma generated in the process vessel is varied so as to selectively resonate the fundamental wave and its harmonics, so that it is possible to maintain high in-plane uniformity of the plasma processing to the semiconductor wafer and stably maintain the state of the plasma in the process vessel.

SUMMARY OF THE INVENTION

However, when the fundamental wave and the harmonics are thus selectively resonated, if a Q value (sharpness of the resonance) becomes too large, only a slight change of the impedance on the electrode side of the plasma results in a great change in etching rate and the like of the semiconductor wafer. Such a Q value of resonance becomes large especially in a process under low pressure (for example, 50 mT or lower) and high power (for example, 500 W or higher).

Further, in even plasma processing apparatuses with the same specifications, conditions in the respective process vessels slightly differ from one another, and if the Q value of resonance becomes too large as described above, there arises a problem of so-called machine difference such as great difference in impedance control among the plasma processing apparatuses. As a result, if substrates are processed in parallel in a plurality of plasma processing apparatuses, there has sometimes occurred variation in processing states of the substrates among the apparatuses.

Therefore, it is an object of the present invention to prevent a Q value of resonance from becoming excessively large in a plasma processing apparatus performing plasma processing by utilizing resonance of a fundamental wave and harmonics as described above.

To attain the above object, according to the present invention, there is provided a plasma processing apparatus which processes a substrate by generating plasma in a process vessel by supply of radio frequency power from a radio frequency power source to at least one of a pair of vertically opposed electrodes disposed in the process vessel, the apparatus including an impedance varying circuit which is connected to at least one of the pair of electrodes and in which an impedance varying part varying impedance on the electrode side of the plasma generated in the process vessel and a resistor are connected in series. According to this plasma processing apparatus, providing the resistor in the impedance varying circuit can prevent a Q value of resonance from becoming excessively large.

In this plasma processing apparatus, the radio frequency power may be supplied from the radio frequency power source to both of the pair of electrodes, the impedance varying part varying the impedance on the electrode side of the plasma generated in the process vessel and the resistor may be connected in series to at least one of the pair of electrodes, and the impedance varying circuit may vary the impedance on the electrode side of the plasma generated in the process vessel so as to resonate at least one of a fundamental wave of the radio frequency power supplied to the opposed electrode, harmonics of the fundamental wave, harmonics of a fundamental wave of the radio frequency power supplied to the own electrode.

The radio frequency power may be supplied from the radio frequency power source to one of the pair of electrodes, the impedance varying circuit in which the impedance varying part varying the impedance on the electrode side of the plasma generated in the process vessel and the resistor are connected in series may be connected to the electrode opposed to the electrode supplied with the radio frequency power, and the impedance varying circuit may vary the impedance on the electrode side of the plasma generated in the process vessel so as to resonate at least one of a fundamental wave of the radio frequency power supplied to the electrode opposed to the own electrode and harmonics of the fundamental wave.

The radio frequency power may be supplied from the radio frequency power source to one of the pair of electrodes, the impedance varying circuit in which the impedance varying part varying the impedance on the electrode side of the plasma generated in the process vessel and the resistor are connected in series may be connected to the electrode supplied with the radio frequency power, and the impedance varying circuit may vary the impedance on the electrode side of the plasma generated in the process vessel so as to resonate harmonics of a fundamental wave of the radio frequency power supplied to the own electrode.

The impedance varying circuit may have two or more of the impedance varying parts each varying the impedance on the electrode side of the plasma generated in the process vessel, and the two or more impedance varying parts may resonate radio frequency waves with different frequencies.

The impedance varying circuit may have a filter selecting a radio frequency wave as a target of resonance. Further, the impedance varying circuit may have two kinds or more of the filters selecting radio frequency waves with different frequencies. Examples of the filter are a high-pass filter, a low-pass filter, and a band-pass filter.

According to another aspect of the present invention, there is provided a plasma processing method which processes a substrate by generating plasma in a process vessel by supply of radio frequency power from a radio frequency power source to at least one of a pair of vertically opposed electrodes disposed in the process vessel, wherein, when an impedance varying part connected to at least one of the pair of electrodes varies impedance on the electrode side of the plasma generated in the process vessel, a Q value of resonance is lowered by a resistor connected to the impedance varying part in series.

In this plasma processing method, two or more of the impedance varying parts may be provided, and the two or more impedance varying parts may vary the impedance on the electrode side of the plasma generated in the process vessel so as to resonate radio frequency waves with different frequencies.

According to the present invention, since the resistor is provided in the impedance varying circuit varying the impedance on the electrode side of the plasma generated in the process vessel, it is possible to prevent the Q value of the resonance from becoming excessively large. This makes it possible to easily control etching rate and the like of a substrate and to inhibit a problem of so-called machine difference such as difference in impedance control among plasma processing apparatuses.

DETAILED DESCRIPTION OF THE INVENTION

Figure 1:
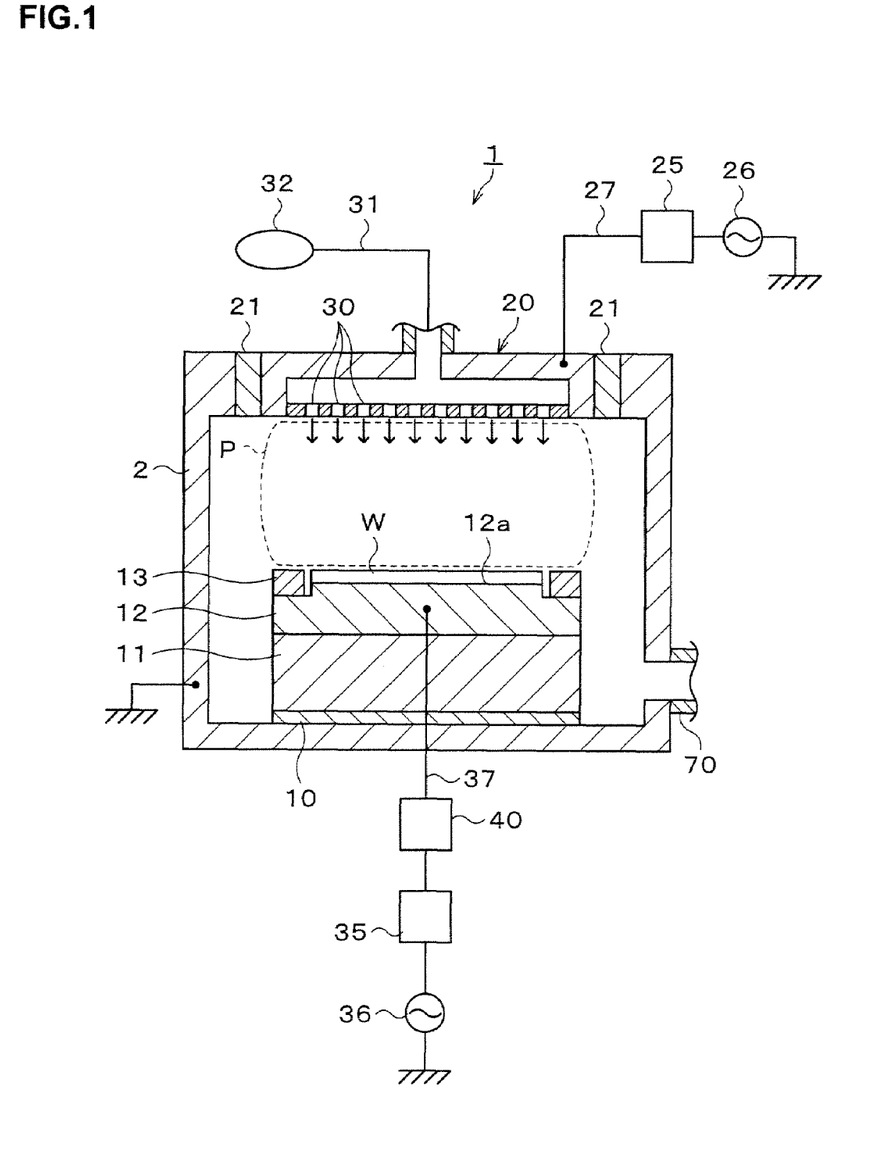
FIG. 1 is a vertical cross-sectional view showing a schematic construction of a plasma etching apparatus according to an embodiment of the present invention.
Figure 2:
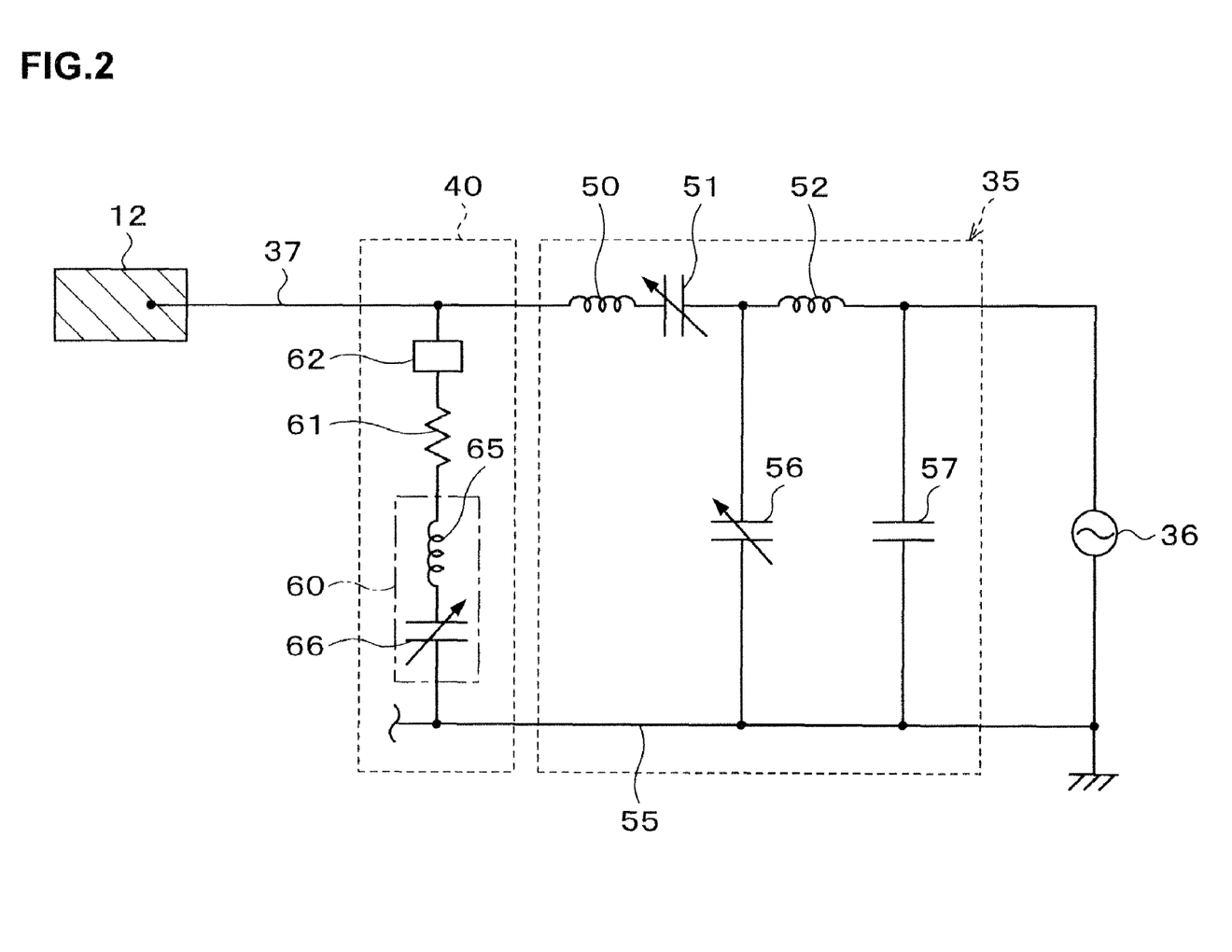
FIG. 2 is a circuitry diagram of a second radio frequency line connected to a lower electrode.

Hereinafter, preferred embodiments of the present invention will be described. FIG. 1 is a vertical cross-sectional view showing a schematic construction of a plasma etching apparatus 1 as a plasma processing apparatus according to an embodiment of the present invention. FIG. 2 is a circuitry diagram of a radio frequency line 37 connected to a lower electrode 12. In the present specification and drawings, constituent elements having substantially the same functions and structures are denoted by the same reference numerals and symbols, and repeated description thereof will be omitted.

As shown in FIG. 1, the plasma etching apparatus 1 includes a process vessel 2 in, for example, a substantially cylindrical shape. An inner wall surface of the process vessel 2 is covered by a protective film of, for example, alumina. The process vessel 2 is electrically grounded.

For example, in a center bottom portion in the process vessel 2, a columnar electrode support table 11 is provided via an insulation plate 10. On the electrode support table 11, a lower electrode 12 as a radio frequency electrode serving also as a mounting table for placing a substrate W thereon is provided. For example, a center portion of an upper surface of the lower electrode 12 protrudes in a columnar shape, and the substrate (semiconductor wafer) W is held on this protruding portion 12a. A ring-shaped focus ring 13 made of quartz is provided around a periphery of the protruding portion 12a of the lower electrode 12.

In a ceiling portion facing the lower electrode 12 in the process vessel 2, an upper electrode 20 in, for example, a substantially disk shape is attached to make a pair with the lower electrode 12. In a contact portion between the upper electrode 20 and a ceiling wall portion of the process vessel 2, a ring-shaped insulator 21 is interposed to electrically insulate the upper electrode 20 from the ceiling wall portion of the process vessel 2.

A first radio frequency line 27 through which radio frequency power for plasma generation is supplied from a first radio frequency power source 26 via a matching circuit 25 is electrically connected to the upper electrode 20. This first radio frequency power source 26 generates the radio frequency power of, for example, 60 MHz and supplies the radio frequency power for plasma generation to the upper electrode 20.

For example, a large number of gas jetting holes 30 are formed in a lower surface of the upper electrode 20. The gas supply holes 30 communicate with a gas supply source 32 via a gas supply pipe 31 connected to an upper surface of the upper electrode 20. The gas supply source 32 stores process gas for etching. The process gas introduced from the gas supply source 32 into the upper electrode 20 through the gas supply pipe 31 is supplied into the process vessel 2 through the plural gas jetting holes 30.

A second radio frequency line 37 through which radio frequency power for bias is supplied from a second radio frequency power source 36 via a matching circuit 35 is electrically connected to the lower electrode 12. This second radio frequency power source 36 generates the radio frequency power with a frequency lower than the frequency of the radio frequency power generated by the first radio frequency power source 26, for example, 13.56 MHz, and supplies the radio frequency power for bias to the lower electrode 12. Incidentally, plasma P is sometimes generated in the process vessel 2 also by this second radio frequency power source 36.

An impedance varying circuit 40 is also provided between the matching circuit 35 and the lower electrode 12 in the second radio frequency line 37 to vary impedance on the lower electrode 12 side of the plasma generated in the process vessel 2.

Here, a circuit configuration of the second radio frequency line 37 connected to the lower electrode 12 will be concretely described. As shown in FIG. 2, the matching circuit 35 has a first fixed coil 50, a first variable capacitor 51, and a second fixed coil 52. In the second radio frequency line 37, the first fixed coil 50, the first variable capacitor 51, and the second fixed coil 52 are connected in series in this order from the lower electrode 12 side toward the second radio frequency power source 36 side.

Between both ends of the second fixed coil 52 and a ground 55, a second variable capacitor 56 and a fixed capacitor 57 are connected in parallel respectively. Such a matching circuit 35 has a function of automatically adjusting impedance of the lower electrode 12 to, for example, 50 Ω in order to prevent the radio frequency power supplied to the lower electrode 12 from the second radio frequency power source 36 from reflecting in the lower electrode 12.

The impedance varying circuit 40 includes an impedance varying part 60, a resistor 61, and a filter 62 which are connected in series between the radio frequency line 37 and the ground 55. The filter 62 cuts radio frequency power of, for example, 13.56 MHz, which is a fundamental wave, supplied from the second radio frequency power source 36 to the lower electrode 12 so as to prevent its flow to the impedance varying part 60 and selects radio frequency power higher in frequency than this fundamental wave so as to allow its passage to the impedance varying part 60 and, for example, a high-pass filter is used.

As will be described later, when the radio frequency power (for example, 60 MHz radio frequency power) for plasma generation is supplied to the upper electrode 20 from the first radio frequency power source 26 and the radio frequency power (for example, 13.56 MHz radio frequency power) for bias which is the fundamental wave is supplied to the lower electrode 12 from the second radio frequency power source 36 to generate the plasma P in the process vessel 2, high-order harmonics such as second, third, fourth, fifth, . . . harmonics of the fundamental wave are generated from the plasma P. The fundamental wave of the radio frequency power for plasma generation and radio frequency power of the harmonics of the fundamental wave pass through the filter 62 in the aforesaid impedance varying circuit 40 to be supplied to the impedance varying part 60. At this time, the impedance varying part 60 is capable of varying the impedance on the lower electrode 12 side of the plasma P so as to resonate at least one of these fundamental wave and plural high-order harmonics.

Further, as described above, the plasma P is sometimes generated in the process vessel 2 also by the radio frequency power for bias supplied to the lower electrode 12 from the second radio frequency power source 36. In such a case, the impedance varying part 60 may vary the impedance on the lower electrode 12 side of the plasma P so as to resonate at least one of the high-order harmonics of the fundamental wave of the radio frequency power for bias.

The impedance varying part 60 includes a fixed coil 65 whose inductance is, for example, about 200 nH and a variable capacitor 66, and is capable of appropriately varying the impedance on the lower electrode side of the plasma P generated in the process vessel 2 by varying capacitance of the variable capacitor 66. Here, the impedance varying part 60 is capable of adjusting the impedance on the lower electrode 12 side of the plasma P by varying the capacitance of the variable capacitor 66 so as to resonate at least one of the fundamental wave of the radio frequency power for plasma generation supplied to the upper electrode 20, the harmonics of the fundamental wave of the radio frequency power for plasma generation, and the harmonics of the fundamental wave of the radio frequency power for bias supplied to the lower electrode 12.

As shown in FIG. 1, an exhaust pipe 70 communicating with an exhaust mechanism (not shown) is connected to a lower portion of the process vessel 2. By vacuuming the inside of the process vessel 2 through the exhaust pipe 70, it is possible to reduce the pressure inside the process vessel 2 to a predetermined pressure.

Next, the operation of the plasma etching apparatus 1 as constructed above will be described.

To perform plasma etching in this plasma etching apparatus 1, first, the substrate W is carried into the process vessel 2 to be placed on the lower electrode 12 as shown in FIG. 1. Then, the inside of the process vessel 2 is exhausted through the exhaust pipe 70 to be reduced in pressure, and further predetermined process gas supplied from the gas supply source 32 is supplied into the process vessel 2 through the gas jetting holes 30. Further, the first radio frequency power source 26 supplies the radio frequency power for plasma generation of, for example, 60 MHz to the upper electrode 20. Further, the second radio frequency power source 36 supplies the radio frequency power for bias of, for example, 13.56 MHz to the lower electrode 12.

Consequently, the radio frequency powers are applied between the lower electrode 12 and the upper electrode 20 and the plasma P is generated between the lower electrode 12 and the upper electrode 20 in the process vessel 2. By this plasma P, active species, ions, and so on are generated from the process gas, so that a surface film of the semiconductor wafer W placed on the lower electrode 12 is etched. After the etching for a predetermined time, the supply of the radio frequency powers to the upper electrode 20 and the lower electrode 12 and the supply of the process gas into the process vessel 2 are stopped, the wafer W is carried out of the process vessel 2, and a series of the plasma etching processes is finished.

Here, during the above plasma etching, the high-order harmonics such as second, third, fourth, fifth, . . . harmonics of the fundamental wave of the radio frequency power for plasma generation are generated from the plasma P in the process vessel 2. Further, in some cases, the high-order harmonics such as second, third, fourth, fifth, . . . harmonics of the fundamental wave of the radio frequency power for bias are also generated. The harmonics of the fundamental wave of the radio frequency power for plasma generation, the harmonics of the fundamental wave of the radio frequency power for bias, and the fundamental wave of the radio frequency power for plasma generation pass through the filter 62 in the aforesaid impedance varying circuit 40 connected to the lower electrode 12 to be supplied to the impedance varying part 60. At this time, the capacitance of the variable capacitor 66 provided in the impedance varying part 60 is adjusted, whereby the impedance on the lower electrode 12 side of the plasma P is varied so as to resonate at least one of the three kinds of waves.

By thus varying the impedance on the lower electrode 12 side of the plasma P to resonate the above three kinds of waves, it is possible to increase etching rate and to highly maintain in-plane uniformity of the plasma processing to the wafer W. When the above three kinds of waves are selectively resonated in this manner, the etching rate is increased on one hand, but on the other, if the Q value of the resonance becomes too large, only a slight change in the impedance on the lower electrode 12 side of the plasma P results in a great change in the etching rate of the semiconductor wafer W.

Figure 3:
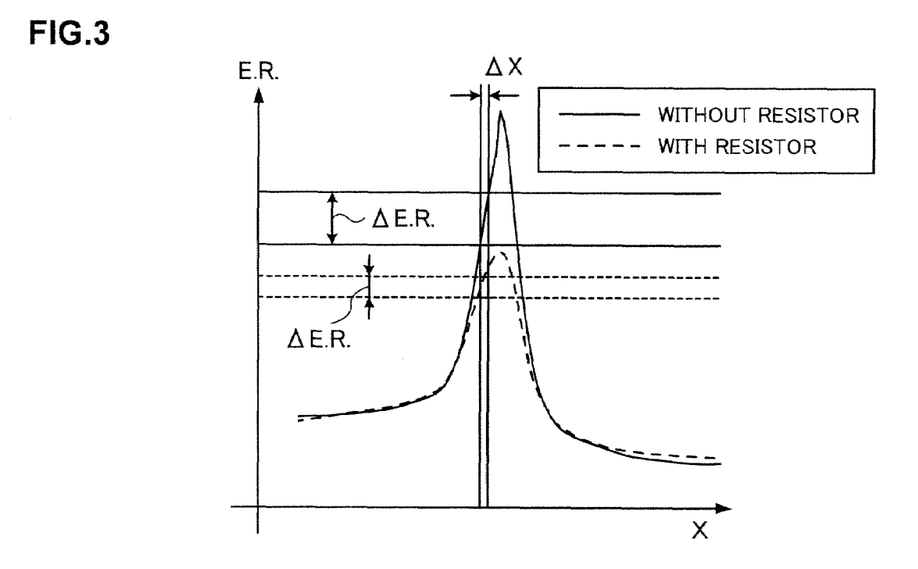
FIG. 3 is a graph showing a change in etching rate E.R. depending on impedance X on the lower electrode side of plasma.

However, such an excessive increase in the Q value can be prevented by the resistor 61 provided in the impedance varying circuit 40. Here, FIG. 3 is a graph showing a change in the etching rate E.R. of the semiconductor wafer W depending on impedance X on the lower electrode 12 side of the plasma P. Near the resonance, an amount of the radio frequency power supplied to the lower electrode 12 side from the plasma P in the process vessel 2 sharply increases, which causes a great increase in the etching rate E.R. of the semiconductor wafer W near the resonance as shown in FIG. 3.

In this case, if the Q value of the resonance becomes excessively large, the etching rate E.R. is difficult to control, but since the resistor 61 is provided in the impedance varying circuit 40, the radio frequency power supplied to the lower electrode 12 side from the plasma P in the process vessel 2 is reduced even near the resonance. This can reduce the sharp increase in the etching rate E.R, as shown by the dotted line in FIG. 3 to prevent the Q value of the resonance from becoming excessively large. Therefore, in controlling the etching rate E.R. and the like, the impedance X on the lower electrode 12 side of the plasma P can be easily adjusted.

Providing the resistor 61 in the impedance varying circuit 40 can also prevent the problem of so-called machine difference such as difference in impedance control depending on each plasma processing apparatus. For example, ΔX in FIG. 3 represents matching precision of the impedance X. That is, it is assumed that variation ΔX exists even if the impedance X is thought to have been set to the same value in a plurality of apparatuses. Of course, the apparatuses are designed to have as little ΔX as possible, but actually, the ΔX cannot be completely eliminated due to measurement precision of a measuring instrument or the like, and is normally about 0.5 Ω. Further, near the resonance, the etching rate E.R. sharply changes and this variation ΔX results in variation in the etching rate E.R, that is, machine difference. According to the present invention, since the resistor 61 is inserted in the impedance varying circuit 40, the change near the resonance is reduced, which can decrease variation ΔE.R. in the etching rate E.R. By selecting a resistance value of the resistor 61 so that the variation ΔE.R for all recipes becomes equal to or lower than a reference value (for example, 5%) for the machine difference, it is possible to eliminate the machine difference ascribable to this phenomenon. Further, in adjusting the impedance X on the lower electrode 12 side of the plasma P, it can be adjusted so as to cause not only a complete resonant state of the above three kinds of waves, but also an incomplete resonant state, for example, about 50% resonant state, and so on, and thus the state of the plasma can be arbitrarily controlled, and the degree of the resonant state can also be easily varied in a range from 0% to 100%.

Incidentally, to facilitate the impedance control by thus inhibiting the Q value of the resonance from becoming excessively large, the resistance value of the resistor 61 is preferably, for example, about 0.5 Ω to about 5 Ω. Further, a typical wire-wound resistor does not effectively operate as a resistor for a radio frequency band (for example, 0.4 MHz to 100 MHz) used in an etching process and the like, and therefore, it is important to use a resistor excellent in radio frequency characteristic. It is also necessary to carefully select a circuit constant of the impedance circuit 40 so that resistance works only to a radio frequency wave with a frequency to be resonated. Specifically, for a radio frequency wave with a frequency not to be resonated, an imaginary component of the impedance is increased to increase the impedance, thereby preventing the passage of current through the resistor 61. In this case, the impedance is adjusted to, for example, 500 Ω or higher (a real component of the resistor 61 is, for example, 5 Ω or lower as described above, but the imaginary component is adjusted to 500 Ω or higher (or −500 Ω or lower)).

Since the filter 62 is provided in the impedance varying circuit 40, the radio frequency power of, for example, 13.56 MHz, which is the fundamental wave, supplied to the lower electrode 12 from the second radio frequency power source 36 is filtered out by the filter 62 and does not flow to the impedance varying part 60. The radio frequency power being this fundamental wave escapes to the ground side via the upper electrode 20, a sidewall of the process vessel 2, and so on.

Hitherto, an example of a preferred embodiment of the present invention has been described, but the present invention is not limited to the form exemplified here. It is obvious that those skilled in the art could reach various modified examples or corrected examples within a range of the spirit described in the claims, and it should be naturally understood that these examples also belong to the technical scope of the present invention. For example, in FIG. 2, the case is described where the serial circuit of the variable capacitor 66 and the fixed coil 65 is used as the impedance varying part 60, but the impedance varying part 60 is not limited to this and may be any circuit, providing that it can vary the impedance on the lower electrode 12 side of the plasma P.

Figure 4:
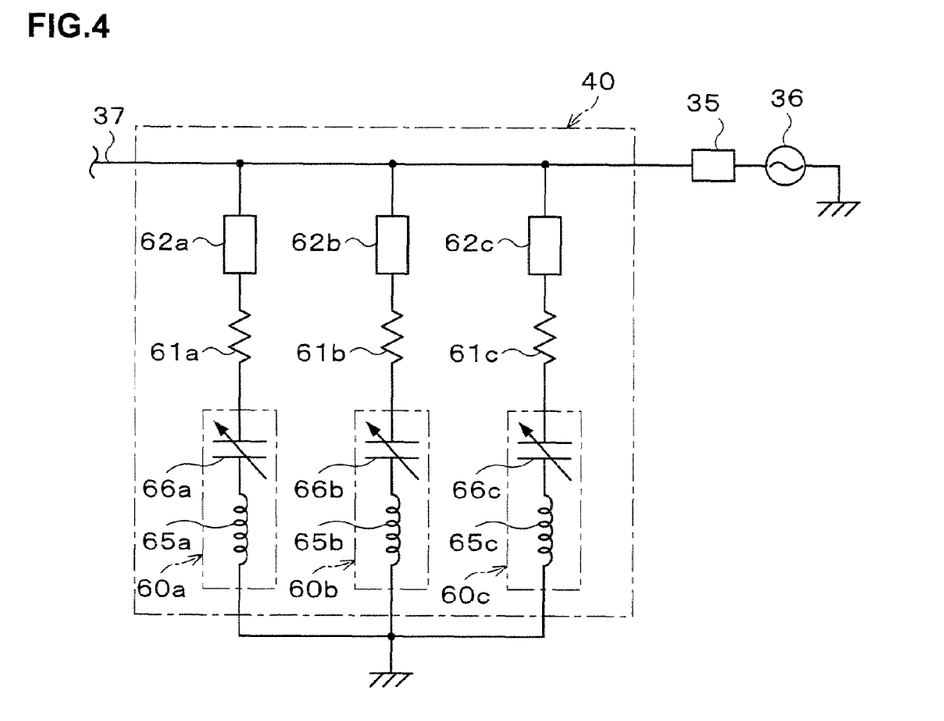
FIG. 4 is a circuit diagram showing a modified example of an impedance varying circuit.
Figure 5:
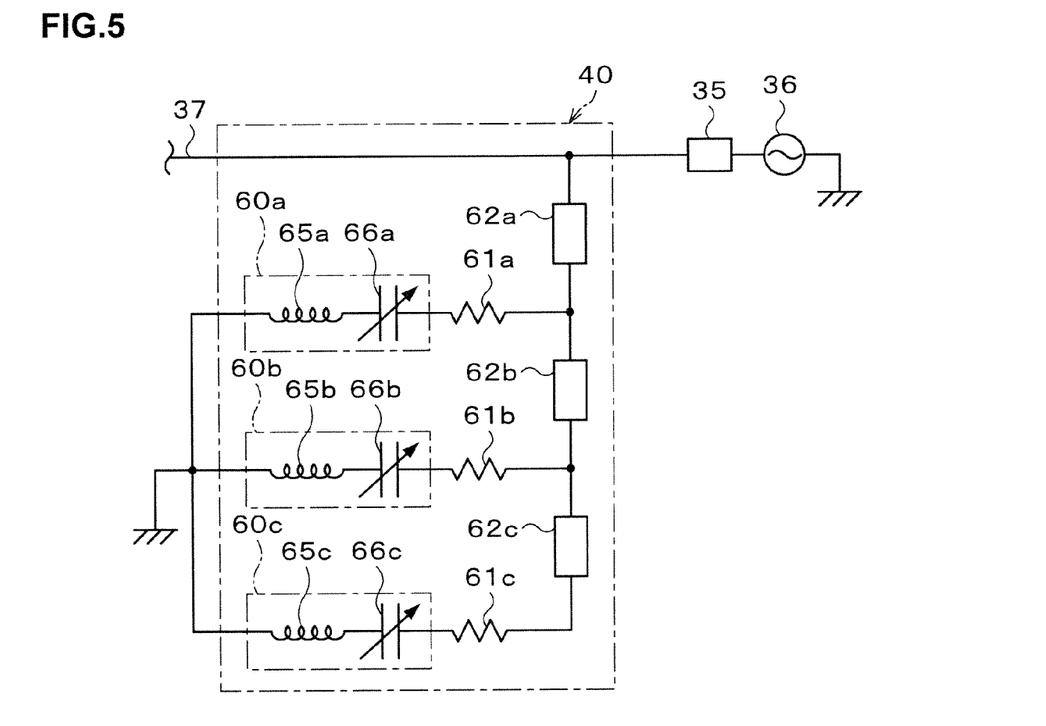
FIG. 5 is a circuit diagram showing another modified example of the impedance varying circuit.
Figure 6:
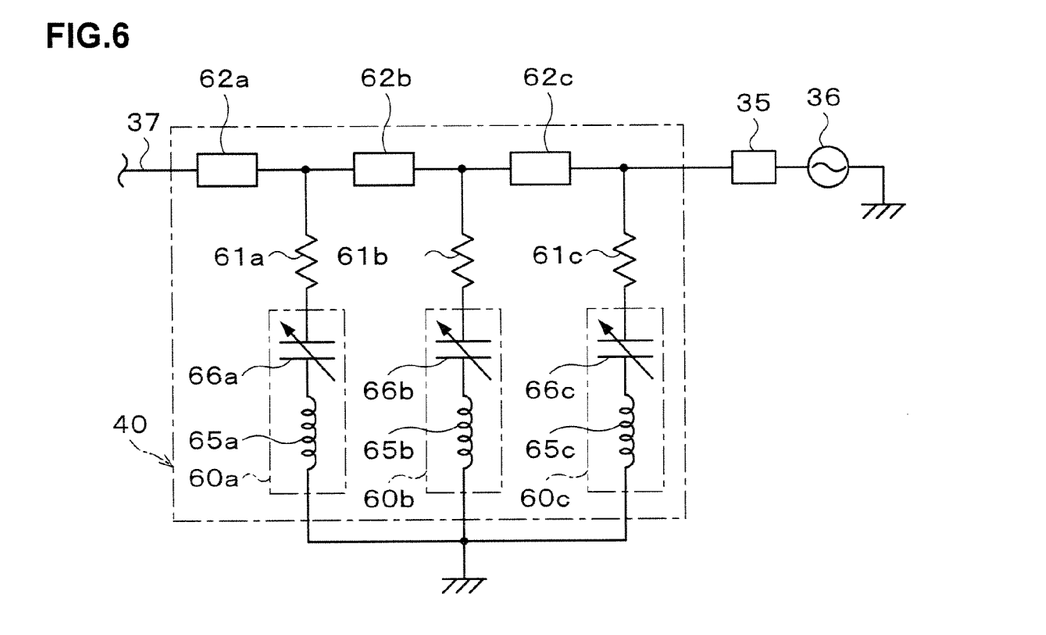
FIG. 6 is a circuit diagram showing still another modified example of the impedance varying circuit.

Further, the impedance varying circuit 40 described with reference to FIG. 2 is structured such that in the impedance varying part 60 composed of one variable capacitor 66 and one fixed coil 65, at least one of the fundamental wave of the radio frequency power for plasma generation supplied to the upper electrode 20, the harmonics of the fundamental wave of the radio frequency power for plasma generation, and the harmonics of the fundamental wave of the radio frequency power for bias supplied to the lower electrode 12 is selectively resonated, but instead, the impedance varying circuit 40 may include a plurality of impedance varying parts so as to be capable of controlling the impedance independently for each of the harmonics. FIG. 4 to FIG. 6 are circuit diagrams showing modified examples of the impedance varying part 40 having such a plurality of impedance varying parts. FIG. 4 to FIG. 6 all show the impedance varying circuit 40 including three impedance varying parts 60a, 60b, 60c, as examples.

In the impedance varying circuit 40 shown in FIG. 4, the first to third impedance varying parts 60a, 60b, 60c, first to third resistors 61a, 61b, 61c, and first to third filters 62a, 62b, 62c are connected in parallel to the second radio frequency line 37. The first to third band pass filters 62a, 62b, 62c pass different harmonics respectively, and in this example, they are set such that the first band-pass filter 62a passes radio frequency voltage in a frequency band around the second harmonic of the fundamental wave of the radio frequency power for bias supplied to the lower electrode 12, the second band-pass filter 62b passes radio frequency voltage in a frequency band around the third harmonic of the fundamental wave of the radio frequency power for bias, and the third band-pass filter 62c passes radio frequency voltage in a frequency band around the fourth harmonic of the fundamental wave of the radio frequency power for bias. These first to third band-pass filters 62a, 62b, 62c of course do not pass the fundamental wave (13.56 MHz) of the radio frequency power for bias. The first to third resistors 61a, 61b, 61c and the first to third impedance varying parts 60a, 60b, 60c are individually connected in series to the first to third band-pass filters 62a, 62b, 62c. The first to third impedance varying parts 60a, 60b, 60c have first to third fixed coils 65a, 65b, 65c and first to third variable capacitors 66a, 66b, 66c respectively, and by varying capacitances of the first to third variable capacitors 66a, 66b, 66c, it is possible for the first to third impedance varying parts 60a, 60b, 60c to vary the impedance on the lower electrode 12 side of the plasma P generated in the process vessel 2.

According to the impedance varying circuit 40 shown in FIG. 4, not only the resonance of one harmonic out of the second to fourth harmonics of the fundamental wave of the radio frequency power for bias can be selectively resonated, but also any two or three of the second to fourth harmonics can be simultaneously resonated. Therefore, characteristics that the respective harmonics have for the plasma processing can be combined in a complex manner.

Further, since the first to third resistors 61a, 61b, 61c are provided, it is possible to prevent the Q value of the resonance from becoming excessively high when the impedance on the lower electrode 12 side of the plasma P generated in the process vessel 2 is varied in the first to third impedance varying parts 60a, 60b, 60c. Therefore, the impedance X on the lower electrode 12 side of the plasma P can be adjusted for any of the second to fourth harmonics, which facilitates controlling the etching rate E.R and the like.

The impedance varying circuit 40 shown in FIG. 5 is structured such that the first to third filters 62a, 62b, 62c are connected in series to the second radio frequency line 37. The first filter 62a is a high-pass filter passing frequencies of the second harmonic or higher of the fundamental wave of the radio frequency power for bias, the second filter 62b is a high-pass filter passing frequencies of the third harmonic or higher of the fundamental wave of the radio frequency power for bias, and the third filter 62c is a high-pass filter passing frequencies of the fourth harmonic or higher of the fundamental wave of the radio frequency power for bias. The first impedance varying part 60a and the first resistor 61a are connected between the first filter 62a and the second filter 62b, the second impedance varying part 60b and the second resistor 61b are connected between the second filter 62b and the third filter 62c, and the third impedance varying part 60c and the third resistor 61c are connected to a downstream side of the third filter 62c.

Similarly to the case previously described with reference to FIG. 4, the impedance varying circuit 40 shown in FIG. 5 is also capable of not only selectively resonating one harmonic out of the second to fourth harmonics of the fundamental wave of the radio frequency power for bias, but also resonating any two or three of the second to fourth harmonics simultaneously. Further, the impedance X on the lower electrode 12 side of the plasma P is adjusted for any of the second to fourth harmonics, which facilitates controlling the etching rate E.R. and the like.

The impedance varying circuit 40 shown in FIG. 6 is structured such that the first to third filters 62a, 62b, 62c are connected in series in the second radio frequency line 37. The first filter 62a is a low-pass filter passing frequencies of the fourth harmonic or lower of the fundamental wave of the radio frequency power for bias, the second filter 62b is a low-pass filter passing frequencies of the third harmonic or lower of the fundamental wave of the radio frequency power for bias, and the third filter 62c is a low-pass filter passing frequencies of the second harmonic or lower of the fundamental wave of the radio frequency power for bias. The first impedance varying part 60a and the first resistor 61 a are connected between the first filter 62a and the second filter 62b, the second impedance varying part 60b and the second resistor 61b are connected between the second filter 62b and the third filter 62c, and the third impedance varying part 60c and the third resistor 61c are connected to a downstream side of the third filter 62c.

Similarly to the cases previously described with reference to FIG. 4 and FIG. 5, the impedance varying circuit 40 shown in FIG. 6 is also capable of not only selectively resonating one harmonic out of the second to fourth harmonics of the fundamental wave of the radio frequency power for bias, but also resonating any two or three of the second to fourth harmonics simultaneously. Further, the impedance X on the lower electrode 12 side of the plasma P is adjusted for any of the second to fourth harmonics, which facilitates controlling the etching rate E.R. and the like.

In FIG. 4 to FIG. 6, the impedance varying circuits 40 are described, each passing the radio frequency voltage in frequency bands of the second to fourth harmonics of the fundamental wave of the radio frequency power for bias supplied to the lower electrode 12, but the frequency bands of the radio frequency voltage passed to the impedance varying circuit 40 are not limited to the harmonics of the fundamental wave of the radio frequency power for bias supplied to the lower electrode 12, but besides, may be the harmonics of the fundamental wave of the radio frequency power for plasma generation. Further, an appropriate combination of these harmonics may be passed to the impedance varying circuit 40.

Figure 7:
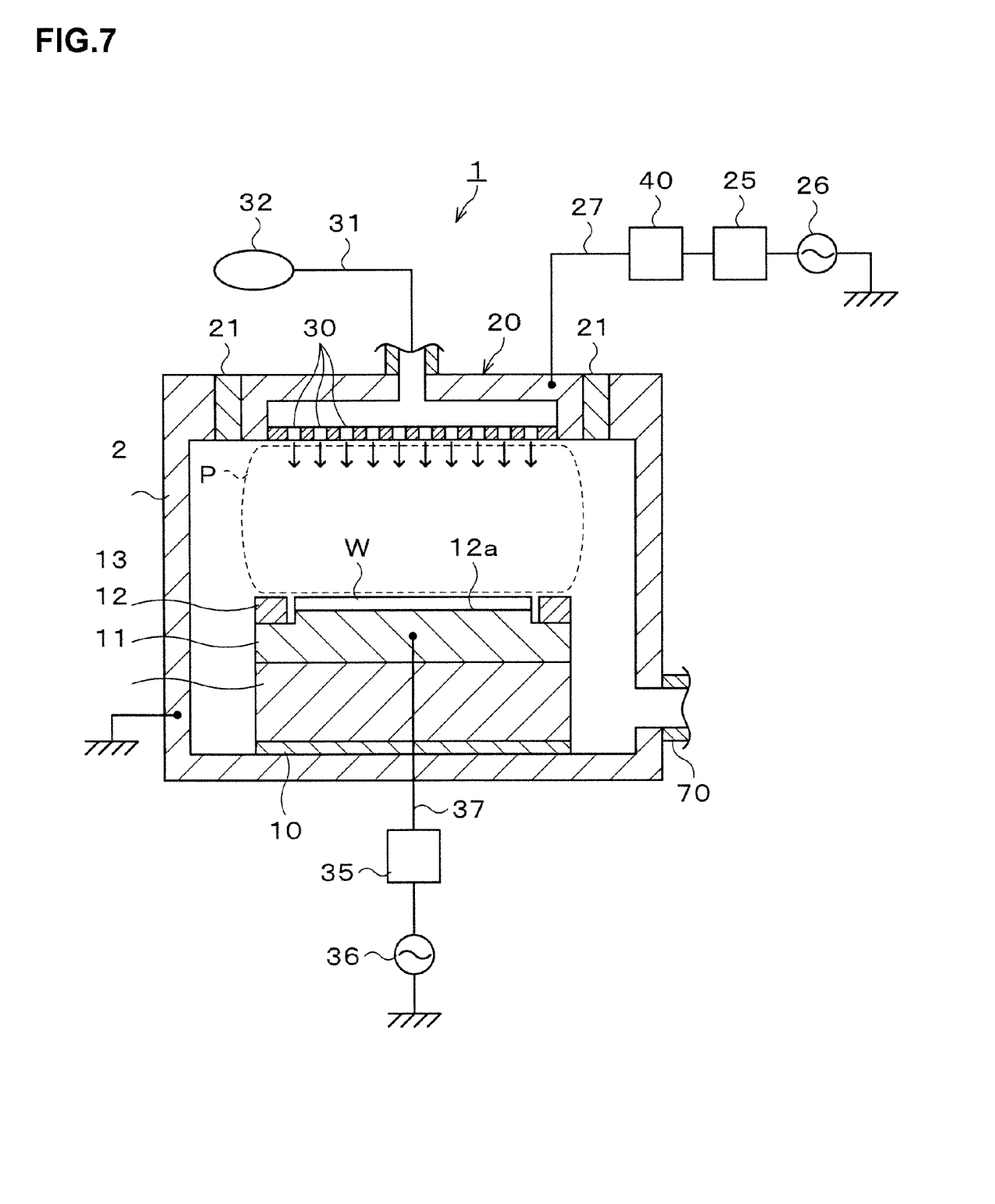
FIG. 7 is a vertical cross-sectional view showing a schematic construction of a plasma etching apparatus according to an embodiment where the impedance varying circuit is provided in a first radio frequency line.

In FIG. 1, described is the case where the impedance varying circuit 40 is provided in the second radio frequency line 37 of the second radio frequency power source 36, but this is not restrictive, and the impedance varying circuit 40 may be provided in any place where radio frequency current flows. FIG. 7 shows an example where the impedance varying circuit 40 is provided not in the second radio frequency line 37 but in the first radio frequency line 27 through which the radio frequency power for plasma generation is supplied to the upper electrode 20 from the first radio frequency power source 26. In the case of the example shown in FIG. 7, the impedance varying circuit 40 may be structured to selectively resonate at least one of the three kinds of waves (the harmonics of the fundamental wave of the radio frequency power for plasma generation supplied to the upper electrode 20, the fundamental wave of the radio frequency power for bias supplied to the lower electrode 12, and the harmonics of the fundamental wave of the radio frequency power for bias) excluding the fundamental wave of the radio frequency power for plasma generation supplied to the upper electrode 20.

Figure 8:
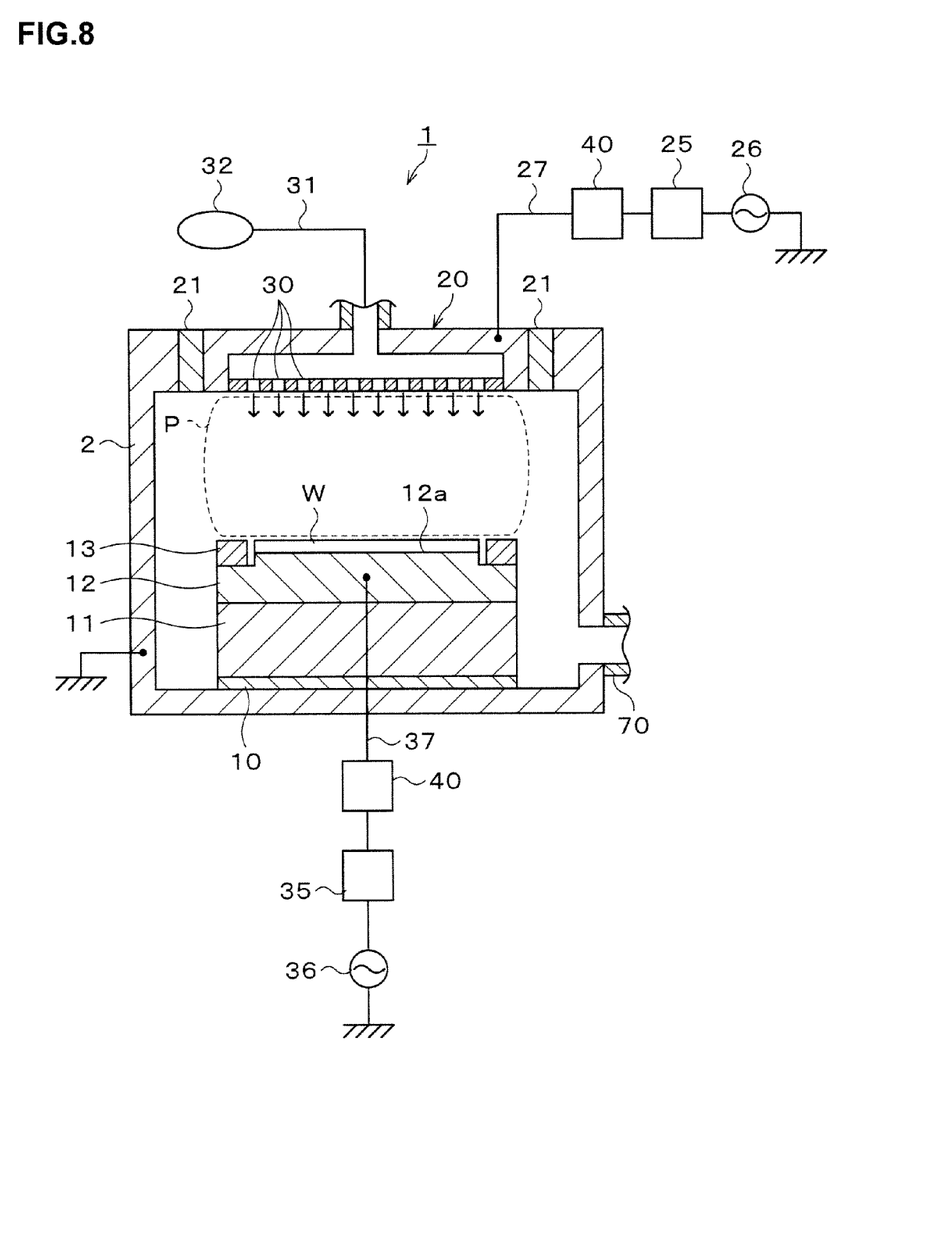
FIG. 8 is a vertical cross-sectional view showing a schematic construction of a plasma etching apparatus according to an embodiment where the impedance varying circuits are provided in the first radio frequency line and the second radio frequency line.

FIG. 8 shows an example where the impedance varying circuits 40 are provided in the second radio frequency line 37 and in addition, in the first radio frequency line 27 through which the radio frequency power for plasma generation is supplied to the upper electrode 20 from the first radio frequency power source 26. In this manner, the impedance varying circuit 40 can be provided in either or both of the radio frequency lines 27, 37 through which the radio frequency powers are supplied to the electrodes 12, 20 respectively. In a case of the example shown in FIG. 8, the impedance varying circuit 40 provided in the first radio frequency line 27 may be structured to selectively resonate at least one of the three kinds of waves (the harmonics of the fundamental wave of the radio frequency power for plasma generation supplied to the upper electrode 20, the fundamental wave of the radio frequency power for bias supplied to the lower electrode 12, and the harmonics of the fundamental wave of the radio frequency power for bias) excluding the fundamental wave of the radio frequency power for plasma generation supplied to the upper electrode 20. The impedance varying circuit 40 provided in the second radio frequency line 37 may be structured to selectively resonate at least one of the three kinds of waves (the fundamental wave of the radio frequency power for plasma generation supplied to the upper electrode 20, the harmonics of the fundamental wave of the radio frequency power for plasma generation, and the harmonics of the fundamental wave of the radio frequency power for bias supplied to the lower electrode 12) excluding the fundamental wave of the radio frequency power for bias supplied to the lower electrode 12.

The above embodiments have described the examples where the radio frequency power sources 26, 36 are connected to the upper electrode 20 and the lower electrode 12 respectively, but this is not restrictive. The present invention is of course applicable to a case where the radio frequency power source is connected to only one of the electrodes. In the case where the radio frequency power source is thus connected only to one of the electrodes, the impedance varying circuit 40 varying the impedance on the electrode side of the plasma P generated in the process vessel 2 is connected to the electrode opposed to the electrode supplied with the radio frequency power. Then, the impedance varying circuit 40 is structured to vary the impedance on the electrode side so as to selectively resonate at least one of the fundamental wave of the radio frequency power source supplied to the opposed electrode and the harmonics of the fundamental wave. Alternatively, in the case where the radio frequency power source is connected to only one of the electrodes, the impedance varying circuit 40 varying the impedance on the electrode side of the plasma P generated in the process vessel 2 may be connected to the electrode supplied with the radio frequency power. In this case, the impedance varying circuit 40 is structured to vary the impedance on the electrode side so as to resonate the harmonics to the fundamental wave of the radio frequency power source supplied to the own electrode. In the above-descried embodiments, the present invention is applied to the plasma etching apparatus 1, but the present invention is also applicable to a plasma processing apparatus for performing substrate processing other than etching, for example, for performing deposition processing. Further, the substrate processed in the plasma processing apparatus of the present invention may be any of a semiconductor wafer, an organic EL substrate, a substrate for FPD (flat panel display), and the like.

What is claimed is:

1. A plasma processing apparatus, which processes a substrate by generating plasma in a process vessel by supply of high-frequency power from different high-frequency power sources to both of a pair of vertically opposed electrodes disposed in the process vessel, the apparatus comprising:
    an impedance varying circuit connected to at least one of the pair of electrodes, and including an impedance varying part which varies impedance of the electrode, seen from the plasma generated in the process vessel, and a resistor connected in series,
    wherein said impedance varying circuit varies the impedance of the electrode, seen from the plasma generated in the process vessel, so as to resonate at least one of a fundamental wave of the radio frequency power supplied to the opposed electrode, harmonics of the fundamental wave, and harmonics of a fundamental wave of a high-frequency power supplied to the electrode having its impedance varied.

2. The plasma processing apparatus according to claim 1, wherein said impedance varying circuit has a filter selecting a radio frequency wave as a target of resonance.

3. The plasma processing apparatus according to claim 1, wherein said impedance varying circuit has two kinds or more of filters selecting radio frequency waves with different frequencies.

4. The plasma processing apparatus according to claim 1, wherein said impedance varying circuit has two or more of the impedance varying parts, and wherein the two or more impedance varying parts resonate radio frequency waves with different frequencies.

5. The plasma processing apparatus according to claim 2, wherein the filter is one of a high-pass filter, a low-pass filter, and a band-pass filter.

6. The plasma processing apparatus according to claim 3, wherein each of the filters is one of a high-pass filter, a low-pass filter, and a band-pass filter.

7. A plasma processing apparatus which processes a substrate by generating plasma in a process vessel by supply of high-frequency power supplied from a high-frequency power source to one of a pair of vertically opposed electrodes disposed in the process vessel, the apparatus comprising:
    an impedance varying circuit connected to the electrode opposed to the electrode supplied with the high-frequency power and including an impedance varying part which varies impedance of the electrode, seen from the plasma generated in the process vessel, and a resistor connected in series,
    wherein said impedance varying circuit varies the impedance of the electrode, seen from the plasma generated in the process vessel, so as to resonate at least one of a fundamental wave of the high-frequency power supplied to the electrode opposed to the electrode having its impedance varied and harmonics of the fundamental wave.

8. A plasma processing apparatus which processes a substrate by generating plasma in a process vessel by supply of high-frequency power supplied from a high-frequency power source to one of a pair of vertically opposed electrodes disposed in the process vessel, the apparatus comprising
    an impedance varying circuit connected to the electrode supplied with the high-frequency power from a high-frequency power source and including an impedance varying part which varies impedance of the electrode, seen from the plasma generated in the process vessel, and a resistor connected in series,
    wherein said impedance varying circuit varies the impedance of the electrode, seen from the plasma generated in the process vessel, so as to resonate harmonics of a fundamental wave of the radio frequency power supplied to the electrode having its impedance varied.

9. A plasma processing apparatus which processes a substrate by generating plasma in a process vessel by supply of high-frequency power from a high-frequency power source to both of a pair of vertically opposed electrodes disposed in the process vessel, the apparatus comprising:
    an impedance varying circuit including an impedance varying part which varies impedance of the electrode, seen from the plasma generated in the process vessel, and a resistor whose resistance value is $0.5\Omega$ to $5\Omega$ connected in series; and
    a matching circuit different from the impedance varying circuit, the impedance varying circuit and the matching circuit connected to at least one of the pair of electrodes.

10. The plasma processing apparatus according the claim 9, wherein the impedance varying circuit is provided between the matching circuit and the electrode having its impedance varied.

* * * * *